Sept. 27, 1960 W. S. FREEBURG 2,954,117

ELECTRICAL CIRCUIT COMPONENT AND METHOD OF PRODUCING SAME EN MASSE

Filed Sept. 20, 1957 2 Sheets-Sheet 1

INVENTOR
WALTER S. FREEBURG

BY Quarles, Fox, Seidel, Bateman & Hoar

ATTORNEYS

INVENTOR
WALTER S. FREEBURG

BY Quarles, Fox, Seidel,
Bateman & Hoar

ATTORNEYS

United States Patent Office 2,954,117 Patented Sept. 27, 1960

1 2

2,954,117

ELECTRICAL CIRCUIT COMPONENT AND METHOD OF PRODUCING SAME EN MASSE

Walter S. Freeburg, Milwaukee, Wis., assignor to Allen-Bradley Company, Milwaukee, Wis., a corporation of Wisconsin Filed Sept. 20, 1957, Ser. No. 685,310

3 Claims. (Cl. 206—56)

The present invention relates to electrical circuit components and the method of forming or making the same en masse, and particularly relates to an array of components, such as electrical capacitors, and to their manufacture.

In the handling of relatively small electrical circuit components, such as capacitors, resistors and other elements having application in the manufacture of electronic devices, such as radios, television receivers, and the like, it often becomes a burdensome and costly time factor in a highly competitive field to include a separate operation for individually segregating these components from a conglomerate bulk, especially where extending terminal leads are apt to have become entangled. In addition, there is the ever-present possibility of mixing components of various ratings, thereby introducing the probability of error in selecting a capacitor, resistor or the like for a particular circuit application, especially where unskilled labor is involved.

It is an object of the present invention to provide an orderly array of electrical circuit components in fixed relationship relative to a carrier or conveyor member with at least one terminal lead securely fastened to the carrier member until such time as it may be desired to remove the circuit component for permanent assembly in a selected electrical device.

In addition, as a means of reducing the cost of manufacture of various electrical circuit components, it has also been found desirable to securely fasten the component or its terminal leads to a conveyor member of wire to provide a means for conveying the unit through its various fabricating steps or stations, and which has special beneficial application in the manufacture of wafer-type capacitors.

It is therefore another object of the present invention to assemble an electrical circuit component directly to a conveyor or carrier member as a means of insuring proper orientation and completion of each and every step in the method of its manufacture, in addition to maintenance of the electrical component in secure attachment to the said carrier member subsequent to assembly for testing, packing and shipment in its finished state to the ultimate consumer or intermediate manufacturer of a consumer product.

Specifically, it is an object of the present invention to provide an array of electrical circuit components comprising a carrier member and a plurality of such components each having a body portion and at least one terminal lead extending and secured to and extending from said carrier member, in addition to providing a novel method of manufacturing the said electrical circuit component.

A further specific object of the present invention is to provide an array of wafer-type capacitors which have been formed throughout their various steps of manufacture from an initial attachment of at least one of their respective terminal leads to a conveyor or carrier member, being conveyed thereby through the various fabricating and/or assembling stations, and which carrier member is permitted to remain as an integral part of the array after final assembly procedures have been completed and during packing and shipment to the ultimate user for his particular capacitor application.

It is still another object of this invention to provide an improved application of an insulating coating composition to opposite sides of a wafer-type capacitor having extending terminal leads in a manner that minimizes the possibility of coating the terminal leads beyond the peripheral margin of the capacitor, thereby permitting subsequent solder connections to be made to the leads immediately adjacent the said peripheral margin.

Referring now to the drawings.

Figure 1:
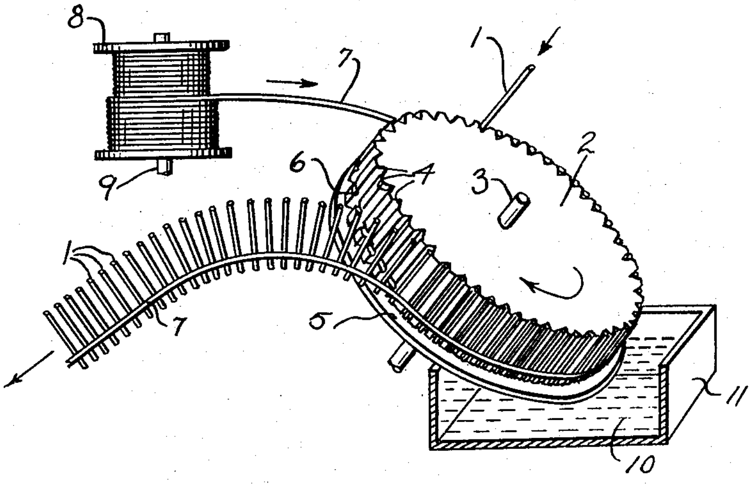
Fig. 1 is a perspective view diagrammatically illustrating a representative station in the manufacture of electrical circuit components, wherein a series of precut terminal leads is secured in laterally spaced array to a continuous carrier or conveyor member, in accordance with the present invention.

A preferred step in the method of manufacturing circuit components in accordance with the present invention is illustrated in Fig. 1, wherein terminal leads, indicated generally by the reference numeral 1, and which have been precut to a prescribed equal length, are fed to a revoluble conveyor wheel 2 which is indicated herein as revolving in a clockwise direction about an angularly disposed axle 3, and which wheel includes peripherally spaced slots or indentations 4. The terminal leads 1 are laid in the indentations with their lower end resting on a radially extending flange or platform 5 providing a convenient means of orientation of the leads for maintaining the ends in a uniform plane. The revoluble wheel 2 includes an annular groove 6 spaced from the flange 5, and which is of a depth sufficient to receive a conveyor or carrier member preferably of wire 7 overlay relationship with the previously positioned terminal leads 1. The carrier wire 7 is commercially obtainable on spools or reels, such as reels 8. The reel 8 is preferably freely revoluble about its axle 9 to permit withdrawal of the continuous carrier wire as needed. It is preferable to select a carrier wire diameter and material which is comparably rigid relative to the leads 1 in order to provide a means of maintaining the assembly in proper orientation during hereinafter described assembly operations.

It is within the province of this invention to provide a substantially continuous carrier member of material other than metallic wire. For instance, a flat band-like member (not shown) of metal, cloth or plastic may be selected which is compatible with the leads 1, so that the leads 1 may be attached thereto by an adhesive, thermal bonding or other method acceptable to the particular material.

Thus, as the conveyor wheel 2 rotates about its axle 3 in the clockwise direction shown, and as the leads 1 are being placed in the indentations 4, the conveyor wire 7 will be withdrawn from the reel 8 and laid thereover angularly relative thereto. The wire 7 serves to retain the leads 1 in position and prevent them from falling out of the said indentations 4 as the wheel 2 revolves about its inclined axis. If desired, a supplementary stationary retaining band (not shown) may be placed about the downwardly facing peripheral portions of the wheel 2 at a position laterally above the conveyor wire 7 for holding the upper portions of the leads 1 in place as the inclined wheel 2 revolves.

Upon rotation of the conveyor wheel 2, it will be apparent that the leads 1 and conveyor wire 7 will be immersed under the level of the solder 10 contained in a heated reservoir 11. Flux may be applied prior to immersion in the solder or may be floated on top of the solder, if so desired. As the wheel 2 is continued in its rotation, the carrier or conveyor member 7 is removed from the wheel at a position shown at the left of Fig. 1, providing sufficient time for solidification of the solder connection, and is transferred in a continuous state, if so desired, to the next station.

It will be readily apparent that the method thus far outlined in the fabrication of electrical circuit components is readily adaptable to any of the conventionally used circuit components, such as resistors, capacitors or other devices having at least one extending lead wire which may be fastened to the conveyor or carrier member 7. However, as previously mentioned, the present invention has particular advantages in the manufacture of wafer-type capacitors.

Figure 2:
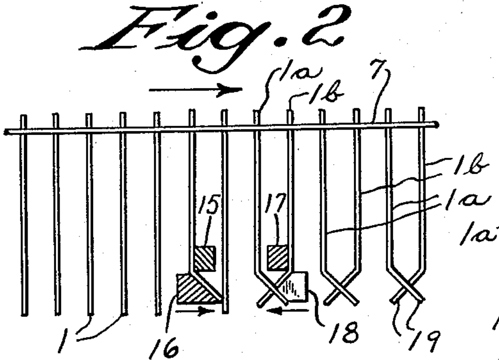
Fig. 2 is an elevational view of the carrier or conveyor member and attached leads, wherein the alternate leads are shown in the process of being bent in opposed angular directions at the free ends thereof for specific application in wafer-type capacitors.

With reference to Fig. 2, the carrier wire 7 and its solder-connected leads 1 may be transferred to a station wherein the free end portions of successive pairs of the laterally spaced leads 1 are bent in opposed directions relative to one another, and where they may be crossed over one another at a preselected side thereof. For instance, the assembly may be transported for positioning between forming die members 15 and 16, wherein the lower die member 16 is provided with a beveled edge arranged to engage an end portion of predetermined length of alternate leads 1*a*, and which die member is moved in a direction substantially normal to the lead while the lead is held from lateral or sidewise movement by the upper die 15 in order to provide the desired degree of angular bend as shown. The same action takes place with respect to bending the end portions of alternate lead members 1*b*. That is, the bent end portions are formed between the upper and lower die members 17 and 18 in substantially the same manner as outlined in connection with lead member 1*a*, except for the direction of bend. There is thus formed an oblique end portion 19 for each lead 1, with the portions 19 of the alternate leads 1*a* crossing the portion 19 of alternate leads 1*b*.

Figure 3:
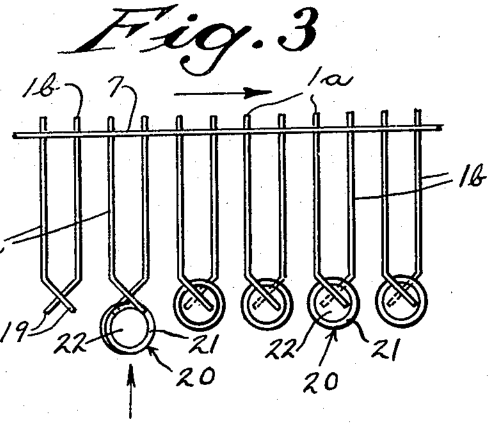
Fig. 3 is an elevational view illustrating an array of the previously formed and relatively positioned bent leads at a station wherein preformed capacitor wafers are inserted between the opposed bent portions.
Figure 4:
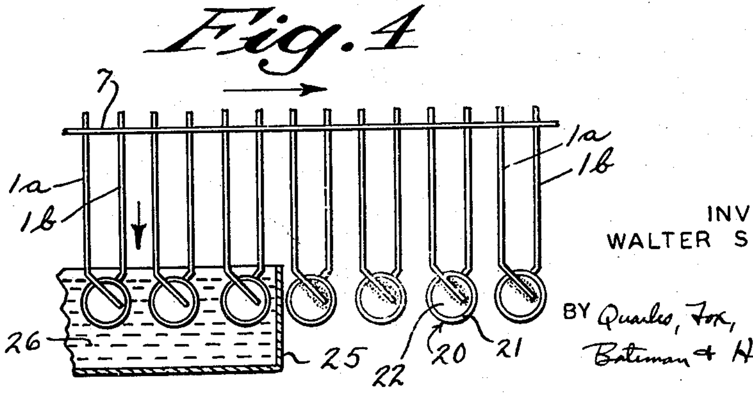
Fig. 4 is an elevational view of the capacitor array illustrative of one manner of fastening the capacitor wafers to the leads by means of dipping the assembly in a solder reservoir.

Following the formation of the oblique end portions 19, the capacitor assembly 20 is inserted between the lead members as illustrated in Fig. 3. It will be apparent that the portions 19 of leads 1*a* and 1*b*, respectively, are preferably oriented relative to one another with the said portion of lead 1*a* lying over lead 1*b*, as viewed in Figs. 2–4, inclusive. Thus, the wafer-type capacitor assemblies 20 may be fed automatically from a fixed direction for reception between the leads 1*a* and 1*b*. As shown, the oblique portions 19 also provide a slight bias in opposed directions towards one another as the portion 19 of lead 1*b* has been displaced slightly from the original plane of connection with the conveyor wire 7. This bias permits temporary retention of the capacitor assemblies 20 prior to permanent anchoring between respective lead members 1*a* and 1*b*.

The capacitor assembly 20 is of a conventional design and generally consists of a steatite or other high dielectric ceramic insulating spacer 21. Although it is preferable to provide a circular spacer disk, as shown, it will be apparent, as the description proceeds, that it is within the province of the present invention to provide capacitors of any desired surface configuration. As conventionally fabricated, the ceramic insulating spacer 21 is provided with silver or other metal electrode plates 22 disposed on opposite sides thereof. The electrode plate material is preferably deposited upon the ceramic spacer 21 in predetermined amounts and over an area calculated to provide the desired capacitive characteristics to the finished assembly. Each electrode plate 22 is preferably in register relative to the oppositely disposed member. As shown, the capacitor assembly 20 is inserted between the cross-over portions of the respective lead members 1*a* and 1*b* and pushed or otherwise moved in a longitudinal direction upwardly, as shown in Fig. 3, to the illustrated position with the bent portions of each lead member disposed at respective sides of the spacer 21.

With the capacitor assembly 20 being temporarily disposed and retained between the lead members 1*a* and 1*b*, the conveyor wire 7 is transported to the next station which comprises a reservoir 25 containing a flux-solder mixture 26. However, in many instances it has been found to be desirable, before transporting the assembly to the station of Fig. 4, to preheat the unit, which operation aids in preventing the ceramic spacer from cracking upon relatively rapid immersion in the solder bath. Upon withdrawal from the solder reservoir 25, the capacitor assembly 20 will be securely fastened to the lead members 1*a* and 1*b*.

Although not specifically shown, it may be desirable to clean the flux and other extraneous foreign matter from the soldered assembly by means of conventional degreasing equipment, including vapor degreasers comprising vaporized solvents, as, for instance, chlorinated hydrocarbons, such as inhibited trichlorethylene or perchlorethylene.

In the manufacture of capacitors, it is desirable to coat the otherwise exposed conducting plates and attached lead portions of the assembly with an insulating material, such as an insulating resin. In many cases, all that is necessary is to immerse the assembled capacitor directly in a reservoir containing the resin and then dry, or otherwise cure, the resin to provide the protective insulating coating thereon. However, it is a part of the present invention to provide an improved method step in applying the resin coating to the capacitor assembly, thus insuring that the resin will remain on the capacitor area without covering anything but the barest minimum portion of the exposed leads.

When a capacitor assembly, whether manufactured in accordance with the present invention as fastened to a carrier or conveyor member, or when individually fabricated, is simply dipped or immersed in an insulating composition to provide an insulating coating, it will be apparent that the depth of immersion is a very difficult thing to control. If the assembly is not immersed to a sufficient depth, it will be apparent that the conducting portions may be exposed for likely contact with other conducting members when placed in use in an electrical circuit, thereby deleteriously affecting circuit operation. In addition, in the course of manufacturing electronic devices, such as radios and television receivers, where space is at a premium, many manufacturers prefer a relatively short terminal lead length whereby they can make solder connections immediately adjacent the junction of the leads and the peripheral margin of the capacitor unit. If the insulating coating has been permitted to cover the lead portions beyond the margin defining the capacitor, it will be apparent that the lead will have to be cleaned by scraping or other operation to permit solder connections to be made thereto. There is also the danger of interrupting the continuous insulating coating if the leads are scraped for soldering, thereby permitting moisture to enter the capacitor unit and affect its operating characteristics.

Figure 5:
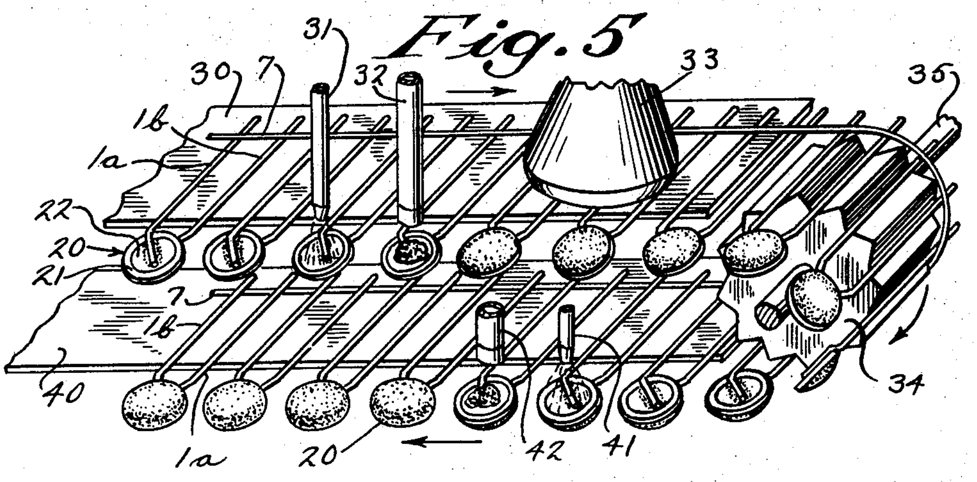
Fig. 5 is a perspective diagrammatic representation of a station wherein there is performed a preferred method of applying an insulating coating to an assembled capacitor unit.

Accordingly, the present invention further contemplates the improved step in the application of an insulating coating to the capacitor assembly. With reference to Fig. 5, it will be apparent that the continuous carrier member or wire 7 may be conveyed to the coating station without severing the wire 7, or, if desired, the wire 7 may first be cut into separate sections and then fed to the coating station with a substantial number of capacitor assemblies attached to each section. The array of capacitor assemblies 20 transported by the carrier wire 7 is preferably maintained with each capacitor 20 being held in a relatively horizontal position, as shown in Fig. 5, and such array may rest upon a platform or table 30 to ensure that the horizontal position is maintained as movement to the right as indicated by the arrow. The coating apparatus may be designed for continuous movement of the array or may be equipped with devices for intermittent start and stop operations at respective stations in the application of the coating.

As mentioned previously, it is preferred to clean the capacitor 20 prior to application of the insulating material. The capacitor 20 is first moved to a position where a surface wetting agent may be sprayed or otherwise applied to the upper surface through an applicator 31. The agent may be of any compatible liquid capable of lowering the viscosity of the later applied resin at the immediate interface between the disk 20 and the resin. A convenient wetting agent is a mixture of ether and ethyl alcohol sold commercially under the trade name "Cellosolve." The capacitor with its wetted surface is then moved to a position where the insulating coating is applied from a dispensing applicator 32, where the resin is preferably distributed centrally of the upper side of the capacitor 20 and tends to spread radially outwardly under the influence of the wetting agent to the defining peripheral margin of the capacitor. The preferred insulating resin in the manufacture of capacitors is prepared from a material under the trade name "Durez Powder 9841," which is a mixture of a phenolic resin and a conventional filler material, and which is suspended in a suitable vehicle such as acetone. The consistency and total amount of resin and vehicle is predetermined in order to provide a relatively exact amount to prevent overflow, or, in the alternative, to prevent an insufficient insulating protective coating from being formed on the surface to be protected. The capacitors with the resin applied thereto are next air dried, or cured. The cure may be hastened by transporting the capacitor under a heat lamp 33 or other heat radiating source. A convenient means of transporting the array of capacitors suspended from the carrier wire 7 is in the form of a simple sprocket drive wheel 34 having peripherally spaced indentations adapted to receive the laterally spaced terminal lead portions 1 of the capacitors. The sprocket wheel 34 is revoluble, as shown in Fig. 5, in a clockwise direction.

The sprocket wheel 34, on rotating about its axis 35, next moves the continuous array to a coating station wherein the opposite side of the capacitor may be coated in the same manner as outlined in connection with the previous steps. That is, the capacitor is again preferably maintained in a horizontal position, resting, while moving on a platform or table 40. The capacitor is first "wetted" by the agent dispensed from the applicator 41 and next moved to the station wherein resin is applied from the applicator 42. The assembly is next cured or air dried, as previously described, prior to testing and inspection operations (not shown).

Figure 6:
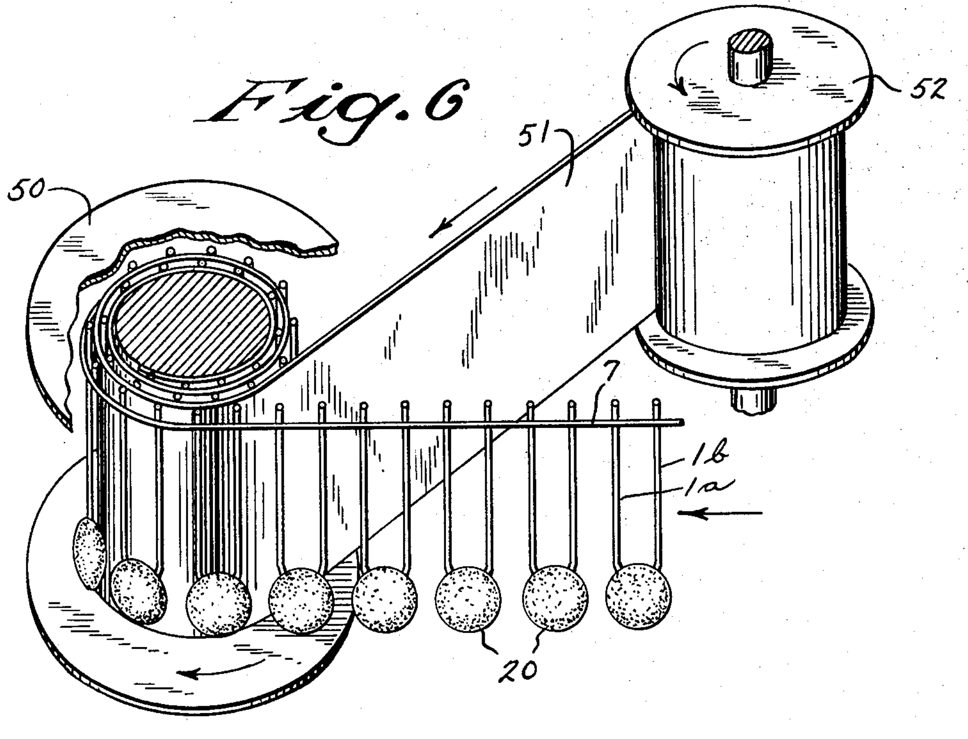
Fig. 6 is a perspective view illustrating an array of capacitors manufactured in accordance with the present invention, and which array is shown being positioned on a spool or reel prior to shipment in the finished state.

The preferred final step in the manufacture of a relatively continuous array is illustrated in Fig. 6, wherein the capacitors 20 suspended from the carrier wire 7 may be wound upon the spool or reel 50 with a separating paper layer 51 being interlaid therebetween to prevent entanglement of members of adjacent layers. The paper layer 51 is supplied from a conventional spool or reel 52. Obviously, relatively small lot quantities of the capacitors 20 may be cut or severed from the continuous carrier wire 7, with the capacitors 20 of each small lot being retained in attached relation to the wire 7 for shipment.

It will be apparent that, although the present invention finds utmost advantage in providing the carrier member 7 both during manufacture of electrical circuit components and thereafter as a means of providing an array of completed assemblies attached thereto, it may be desired, at times, to remove the carrier member after manufacture and before packaging. This will permit salvage of the wire, if so desired. In this case, the leads of the assemblies may be severed just short of the carrier wire or may be removed by melting the solder connection with the conveyor wire.

I claim:

1. An array of electrical circuit components comprising an independent flexible carrier wire; a plurality of electrical circuit components each having a body portion and at least one electrically conductive terminal lead extending therefrom, said terminal lead having a free end, said components being arranged such that the terminal leads are in a spaced, substantially parallel relationship, said terminal leads lying upon and engaging said carrier wire transversely thereof and being secured thereto.

2. The array of claim 1, wherein the said terminal leads are soldered to the said carrier wire.

3. An array of electrical capacitors comprising an independent flexible carrier wire; a plurality of capacitor units each having a body portion and at least one electrically conductive terminal lead extending therefrom, said terminal lead having a free end, said capacitors being arranged such that the terminal leads are in a spaced, substantially parallel relationship, said terminal leads lying upon and engaging said carrier wire transversely thereof and being secured thereto.

References Cited in the file of this patent

UNITED STATES PATENTS

| | | |
|---|---|---|
| 320,381 | Meyrose | June 16, 1885 |
| 2,214,230 | Freeburg | Sept. 10, 1940 |
| 2,321,071 | Ehrhardt et al. | June 8, 1943 |
| 2,604,986 | Berg | July 29, 1952 |
| 2,606,955 | Herrick | Aug. 12, 1952 |
| 2,795,038 | Martiny | June 11, 1957 |
| 2,815,124 | Pellier | Dec. 3, 1957 |
| 2,830,698 | Coda et al. | Apr. 15, 1958 |